United States Patent [19]

Leger et al.

[11] Patent Number: 4,813,762

[45] Date of Patent: Mar. 21, 1989

[54] COHERENT BEAM COMBINING OF LASERS USING MICROLENSES AND DIFFRACTIVE COUPLING

[75] Inventors: James R. Leger, Groton; Wilfrid B. Veldkamp, Lexington; Miles L. Scott, Bedford, all of Mass.

[73] Assignee: Massachusetts Institute of Technology, Cambridge, Mass.

[21] Appl. No.: 154,898

[22] Filed: Feb. 11, 1988

[51] Int. Cl.$^4$ .............. G02B 27/44; G02B 5/08; H01S 3/098; H01S 3/19

[52] U.S. Cl. .............. 350/162.16; 350/167; 350/601; 372/18; 372/44; 372/71

[58] Field of Search ............ 350/162.16, 167, 601; 372/18, 44, 71, 72, 75

[56] References Cited

U.S. PATENT DOCUMENTS 4,764,929 8/1988 Thaniyavarn .............. 372/18

OTHER PUBLICATIONS

Diffracted Coupled Phase-Locked Semiconductor Laser Array, American Institute of Physics, Appl. Phys. Lett 42(7), 1 Apr. 1983, J. Katz et al.
Phase-Locked InGaAsP Laser Array with Diffraction Coupling, American Institute of Physics, Appl. Phys. Lett 43(2), 15 Jul. 1983, T. R. Chen et al.
In-Phase Locking in Diffraction-Coupled Phased-Array Diode Lasers, American Institute of Physics, Appl. Phys. Lett. 48(26), 30 Jul. 1986, Shyh Wang et al.
Investigation of a Multielement Electron-Beam-Pumped Semiconductor Laser with an External Mirror, American Institute of Physics, Sov. J. Quant. Electron, vol. 4 No. 10, Apr. 1975, S. A. Darznek et al.
Phase Locking of a Two-Dimensional Array of $CO_2$ Waveguide Lasers, American Institute of Physics, Sov. Tech. Phys. Lett. 11(2), Feb. 1985, A. F. Giova et al.
Rectangular-Apertured Micro-Fresnel Lens Array Fabricated by Electron-Beam Lighography, Applied Optics, Feb. 1987, vol. 26, No. 3, Teruhiro Shino et al.

Primary Examiner—John K. Corbin
Assistant Examiner—David J. Edmondson

[57] ABSTRACT

A diffractive lenslet array receives light from multiple lasers. The lenslet array is spaced apart from a partially reflecting mirror by a distance $Z = nd^2/\lambda$ where n is an integer or half integer, $\lambda$ is the laser wavelength and d is the spacing of the lenslets in the array. In a preferred embodiment the apparatus is a unitary design in which the lenslets are etched into one surface of a substrate and a parallel surface is coated to form the partially reflecting mirror. The lenslets abut one another to produce a fill factor (percentage of array containing light) close to one and each of the lenslets is a multistep diffractive lens. Diffractive speading over a round trip distance from lasers to mirror and back again causes feedback light from a single lenslet to couple into adjacent lenslets. The light from all the lenslets is coupled back into the laser waveguides efficiently only when the wavefront at each of the lenslets is flat, that is, when the phase of the feedback is uniform across a lenslet. Uniformity is achieved when the separation between lenslet array and mirror is the Talbot self-imaging condition set forth above.

15 Claims, 4 Drawing Sheets

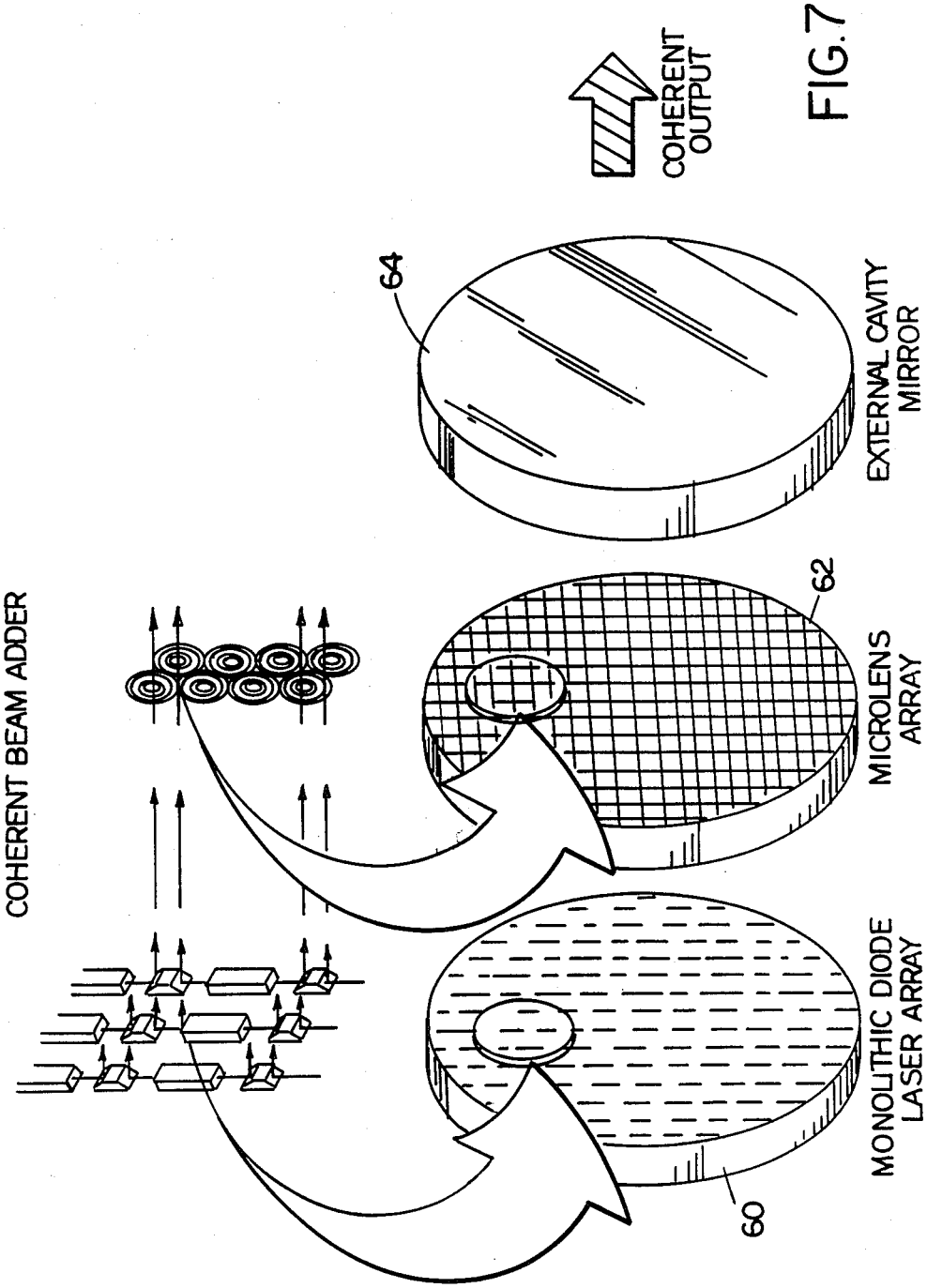

COHERENT BEAM COMBINING OF LASERS USING MICROLENSES AND DIFFRACTIVE COUPLING

The Government has rights in this invention pursuant to Contract Number F19628-85-C-0002 awarded by the Department of the Air Force.

BACKGROUND OF THE INVENTION

This invention relates to combining plural laser beams coherently.

Individual semiconductor lasers are currently limited in output power by either catastrophic facet damage or heat build up. Linear arrays of lasers have been developed that produce higher power by combining many individual lasers. Monolithic surface emitting geometries allow laser arrays to be constructed in two dimensions as well. In addition to high power, however, many applications also require a source with high brightness, or power per unit area per unit solid angle. High brightness requires mutual coherence among the individual lasers. In addition, the individual beams must be combined to produce a single lobed, far-field pattern with negligible side lobes. The present invention establishes mutual coherence among lasers and combines their outputs to generate a single lobed, far-field pattern.

SUMMARY OF THE INVENTION

The apparatus according to the invention for coherent beam combining of lasers includes a diffractive lenslet array for receiving light from the lasers. The focal lengths of the lenslets are chosen to collimate the expanding beams at the point where they just start to overlap. The lenslet array is spaced from a partially reflecting mirror by a distance $Z_0 = nd^2/\lambda$ where n is an integer or half integer, $\lambda$ is the laser wavelength and d is the spacing of the lenslets in the array. This spacing $Z_0$ between the lenslet array and the mirror, the Talbot distance, is selected so that the phase of feedback light across a lenslet is uniform to ensure that coupling back into the laser waveguides is efficient. It is preferred that the diffractive lenslets have a multilevel configuration including four or more phase levels. The shape of the multilevel phase patterns may be chosen to provide arbitrary aberration correction. For example, elliptical patterns may be used to create an anamorphic lens for correcting laser astigmatism. The lenslet arrays may either be one- or two-dimensional.

In one embodiment, the optical element is a single substrate with the diffrative lenslet array etched on one surface and a mirror coating applied to a parallel surface. The thickness of the substrate is the Talbot distance in which $\lambda$ is the wavelength of light as it propagates through the substrate medium.

BRIEF DESCRIPTION OF THE DRAWING

FIG. 7 is a schematic view of a two-dimensional embodiment of the invention for a two-dimensional surface emitting laser array.

DESCRIPTION OF THE PREFERRED EMBODIMENT

Figure 1:
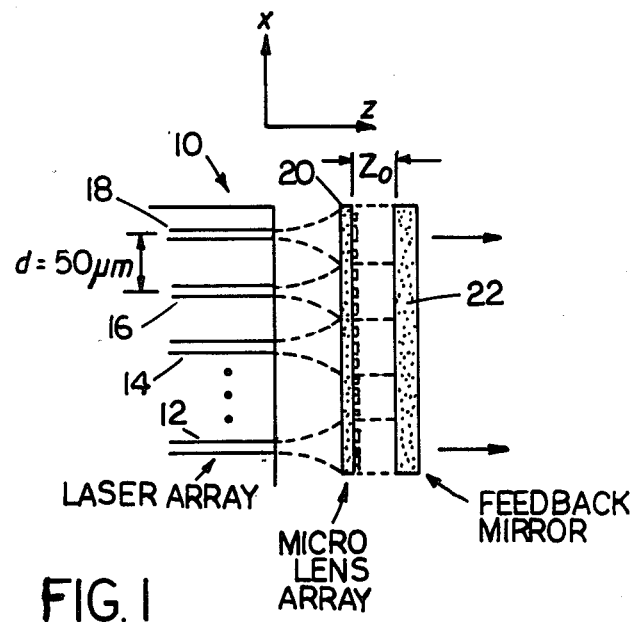
FIG. 1 is a cross-sectional view of the laser beam combining system of the present invention.

With reference to FIG. 1, a laser array 10 includes individual semiconductor lasers 12, 14, 16, and 18 spaced a distance d apart. In the present demonstration, $d = 50$ $\mu$m. The output facets of the lasers are provided with an antireflection coating. Suitable lasers are AlGaAs diode lasers made by Spectra Diode Laboratory which operate at a wavelength of 0.8 $\mu$m. It will be appreciated by those skilled in the art that the number of lasers shown in FIG. 1 is entirely exemplary and that an array would generally include many more lasers. In addition, other types of lasers could be used at other wavelengths (e.g., InGaAsP at 1.3 $\mu$m). In the present demonstration, a one dimensional laser array consisting of seven gain-guided multiple-quantum-well lasers was utilized in experiments at the Lincoln Laboratory of the Massachusetts Institute of Technology, but the concept can be extended to hundreds of lasers in two dimensions. As shown in FIG. 1, light from each of the lasers diverges due to diffraction effects of the laser aperture. At the point where the diverging beams just start to overlap, a microlens array 20 is interposed to intercept the beams. The lenslet array 20, to be described in more detail in conjunction with FIG. 2 below, collimates each of the individual beams. After collimation, a portion of the light is reflected from a partially reflecting flat feedback mirror 22 and another portion is transmitted.

Figure 2:
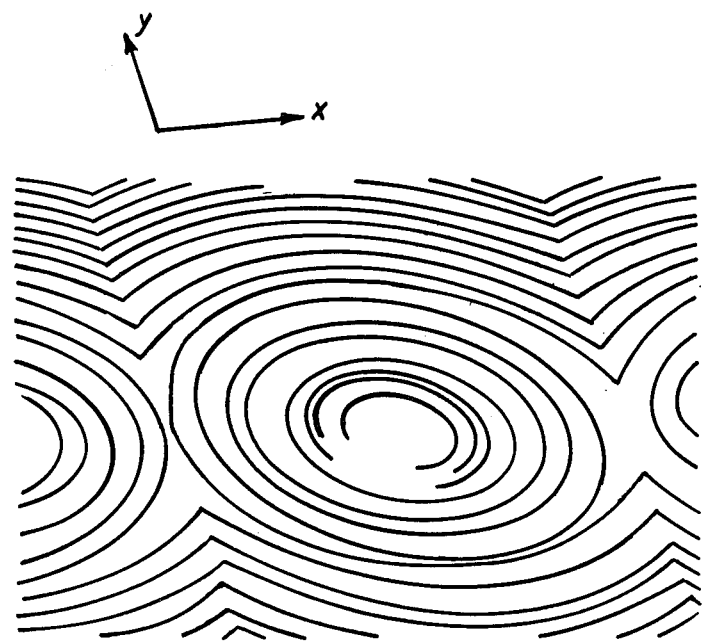
FIG. 2 is a scanning electron photomicrograph of the central region of an anamorphic microlens array.

The lenses in the lenslet array 20 have a separation equal to the laser spacing and are of a size and shape to eliminate gaps between lenses which would lower the fill factor of the array and result in side lobes in the far field. FIG. 2 is a scanning electron microscope photograph of a portion of the array 20 showing lenses with abutting rectangular apertures.

The focal length of the lenses is chosen to optimize the amount of light coupled into the central far-field lobe. A larger focal length captures only the central portion of the light from each laser; a smaller focal length results in a nonuniform light field across the lenslet array and a loss of power into sidelobes. The lenses must also have low aberrations to achieve near diffraction-limited performance. In addition, it may be desirable to introduce some wavefront correction in the lenses to compensate for aberrations in the individual lasers. Finally, the lenses should not introduce significant loss. Since the lenslet arrays are made by photolithography and reactive ion etching (described below), the individual lenses can be made to satisfy all of the above requirements.

In the present demonstration, a lens spacing of 50 microns was chosen to match the spacing of the lasers in the laser array 10. The focal length was chosen to be 100 microns in the direction lateral to the array (x axis)

so that the diffracted beams from individual lasers would just fill the lenslets. This resulted in an f/2 lens lateral to the array because of the 50 micron lens width in the x direction. To compensate for the 1.23 waves of astigmatism measured from the gain-guided lasers, the transverse focal length (y-axis out of the plane of FIG. 1) was chosen to be 69 microns. This anamorphic lens resulted in the elliptical Fresnel zone patterns shown in FIG. 2. The eccentricity of the elliptical patterns was 0.37. By choosing the height of the lenses to be 69 microns, a lens speed of f/1 was achieved transverse to the laser array (y-axis). By locating the lenslet array 20 approximately 69 microns from the laser array 10, the beams from the lasers just filled each of the lenses in the array 20.

A diffractive microlens is constructed by subtracting integral numbers of wavelengths from the lens transmittance function so that the resulting phase function is constrained between 0 and $2\pi$. In the present demonstration, the transmittance function of the anamorphic lens was given by $$t(r,\theta) = \exp[jkf_1]\exp[-j(k\sqrt{f_1^2 + r^2} + (k/2f_2)r^2\sin^2\theta)], \quad (1)$$

where k is the wavenumber of the light, $f_1$ is the focal length of a circularly symmetric lens (100 microns), and $f_2$ is the focal length of a cylindrical lens parallel to the lens array (222 microns). The focal length of the combined lenses transverse to the array is 69 micron. Note that the first term in the exponential represents a perfect collimating lens and so does not have the spherical aberration associated with spherical lenses. The second term represents pure astigmatism with a quadratic phase curvature chosen to cancel the laser astigmatism. Any combination of aberration correction terms can of course be used to produce a general single element aspheric lens.

The etched lens pattern consists of a quantized version of the phase transmittance in equation (1). The boundaries between the etch levels of a binary lens (two phase levels) are given by the locus of points $(r,\theta)$ which satisfy the equation $$k\sqrt{f_1^2 + r^2} + (k/2f_2)r^2\sin^2\theta = n\pi + kf_1 \quad (2)$$

for various values of the integer n. These points form Fresnel zones which are nearly elliptical in shape.

The diffraction efficiency of the simple binary diffractive lens in equation (2) is 40.5%. This efficiency can be increased by etching multiple levels to better approximate equation (1). (See U.S. patent application Ser. No. 099,307 entitled "High Efficiency Multi-level Diffractive Optical Elements", by G. Swanson and W. Veldkamp). It can be shown that the diffraction efficiency of a multilevel diffractive lens is given by $$\eta = \left|\frac{\sin(\pi/N)}{\pi/N}\right|^2 \quad (3)$$

where N is the number of etched phase levels.

In the present demonstration, four etch levels were fabricated, corresponding to a theoretical lens diffraction efficiency $\eta=81\%$. Equation (2) was modified to describe the etch levels of each etch mask p (p=1,2):

$$k\sqrt{f_1^2 + r^2} + (k/2f_2)r^2\sin^2\theta = n\pi/m + kf_1, \quad (4)$$

where $m=2^{(p-1)}$. Equation (4) can be applied to any number of masks (p) and etch levels (m).

The diffractive anamorphic microlens array described here was fabricated completely by mask-and-etch techniques used in producing integrated electronic circuits. High quality aspheric lenses of arbitrary size and shape can be fabricated with this method. In addition, large arrays of lenses can be produced as easily as single lenses.

Figure 3:
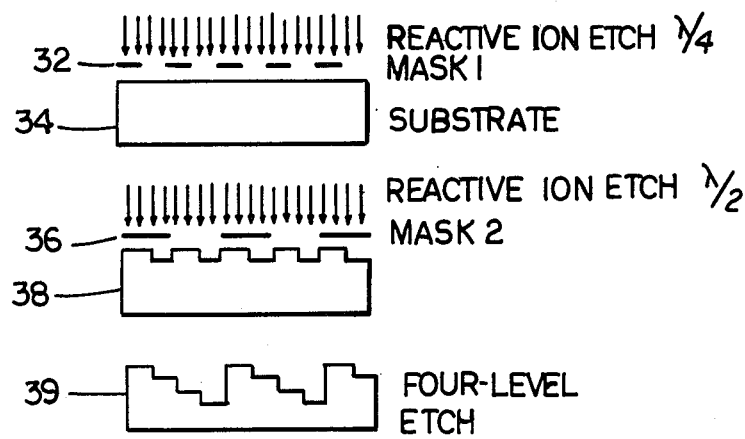
FIG. 3 illustrates the fabrication steps necessary to produce a four level diffractive lens.

Fabrication took place in three stages: (i) computer-aided design and generation of a master mask, (ii) transferring the mask pattern onto the lens substrate using photolithography, and (iii) etching the pattern into the substrate material. Two master masks were produced corresponding to the two etching steps of the four-level lens. The master masks were replicated by vacuum-contact photolithography onto thin chromium-coated glass plates (flex masks). These flex masks were used to expose a layer of photoresist on a chromium coated quartz substrate by vacuum contact photolithography. The mask with the smallest features was printed first. After photoresist development the exposed chromium was wet-etched, leaving a patterned etch stop 32 on the substrate 34 shown diagrammatically in FIG. 3. The substrate was reactive-ion etched to a depth corresponding to a phase retardation of one-quarter wavelength using $CHF_3$, after which the etched substrate 38 was recoated with photoresist, and the second mask 36 (large features) was aligned to the etched pattern on the substrate. After etching to remove exposed chromium, the substrate was reactive-ion etched to a depth corresponding to a phase retardation of one-half wavelength. The resulting four-level etch profile 39 has a theoretical diffraction efficiency of 81%. Measured diffraction efficiencies of the four level lens shown in FIG. 2 ranged from 70% across an f/2 region of the lens to 80% in the central f/4 region. Higher diffraction efficiencies can be obtained by using a larger number of etch levels. For example, 16 levels (corresponding to 4 etches) produces a diffraction efficiency of 98.7%.

A key aspect of the present invention is maintaining mutual coherence among the beams across the laser array. Mutual coherence can be established by using diffractive coupling from an external cavity. FIG. 1 shows the flat feedback mirror 22 located a distance $Z_0$ from the lenslet array 20. Diffractive spreading from propagation over a round trip distance $2Z_0$ causes the feedback light from a single lenslet to couple into adjacent lenslets. This coupling locks together the phases of the individual lasers in the laser array 10. However, the light from all the lenslets is coupled back into the laser waveguides efficiently only when the wavefront at each of the lenslets is flat, that is, when the phase of the feedback light is uniform across a lenslet. Satisfying this condition gives rise to discrete values of the output mirror distance $Z_0$.

Since the light collimated by the lenslet array 20 is periodic with a period d given by the lenslet spacing, the amplitude can be expressed by a Fourier series $$A(x, Z = 0) = \sum_{m=-\infty}^{\infty} a_m \exp[-j2\pi mx/d], \quad (5)$$

where a one-dimensional analysis is used for simplicity. This corresponds physically to a set of discrete plane waves of amplitude $a_m$. After propagation by a distance Z, the complex amplitude of the mth plane wave is multiplied by $$H(m,z) = \exp[j2\pi z/\lambda]\exp[j\pi z\lambda m^2/d^2] \quad (6)$$

where the paraxial approximation is assumed for simplicity. After a round-trip propagation of $2Z_0$, the resultant complex amplitude distribution can be calculated by applying the phase delays of equation (6) to the plane waves in equation (5) and evaluating the expression at $2Z_0$.

$$A(x, 2Z_0) = \exp\left[j2\pi \frac{2Z_0}{\lambda}\right] \sum_{m=-\infty}^{\infty} a_m \exp\left[-j2\pi \frac{mx}{d}\right] \exp\left[j\frac{\pi 2Z_0 \lambda m^2}{d^2}\right]. \quad (7)$$

It is apparent that when $$2Z_0 = 2nd^2/\lambda, \; n = \text{integer}, \quad (8)$$

apart from an unimportant constant phase, the amplitude distribution in equation (7) is identical to the original amplitude distribution in equation (5). This self-imaging of a periodic light distribution is called the Talbot effect. When equation (8) is satisfied, the feedback light incident on the lenslet array is a self image of the original array of collimated beams and the lenslets can focus the light efficiently back into the laser waveguides.

Equation (8) states that, aside from the edge effects resulting from a finite size laser array, self-images can be produced at an infinite number of discrete mirror spacings. The diffraction from a single lenslet increases, however, as the free space propagation is increased. Thus, the extent of the coupling can be controlled by choosing the proper value of n. When n=1, the coupling is primarily to nearest neighbors. For larger values of n, the coupling is distributed over larger numbers of lasers. The ability to control the extent of the coupling is important for preserving coherence over a large number of lasers.

Figure 4A:
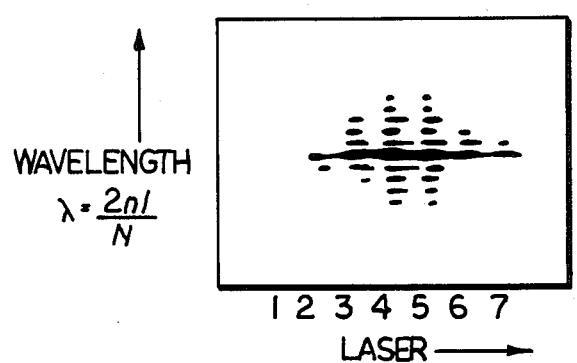
FIG. 4a is a graph of the spectrum of the lasers whose beams are phase locked by the external cavity.
Figure 4B:
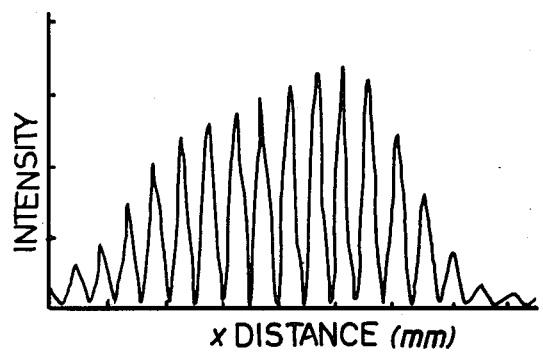
FIG. 4b is a measurement of coherence between two widely-spaced lasers, showing near perfect coherence.

Experiments were performed using a modification of the set-up shown in FIG. 1. An afocal imaging system was added between the lenslet array and the ouput mirror. This made it physically possible to place the output mirror in the image plane of the afocal system, corresponding to no diffractive coupling ($Z_0=0$). The mirror could then be moved back from this point to provide diffractive coupling. With $Z_0=0$, lasing was observed but there was no mutual coherence detected between lasers. The lasing wavelengths varied by as much as twenty angstroms from one laser to the next. When the mirror was placed 3.1 mm behind the image plane corresponding to the first Talbot plane (n=1), strong lasing was again observed. This time the array operated as a coherent ensemble. The spectrum of each laser is shown in FIG. 4a. It is apparent that the lasers are now lasing on the same spectral line. The lasers at the edge of the array received less feedback due to edge effects in the Talbot self-image, and are lasing less strongly. Light from the third and sixth lasers was interferred to measured the mutual coherence. The interference pattern is shown in FIG. 4b, indicating strong mutual coherence between laser sources.

Figure 5:
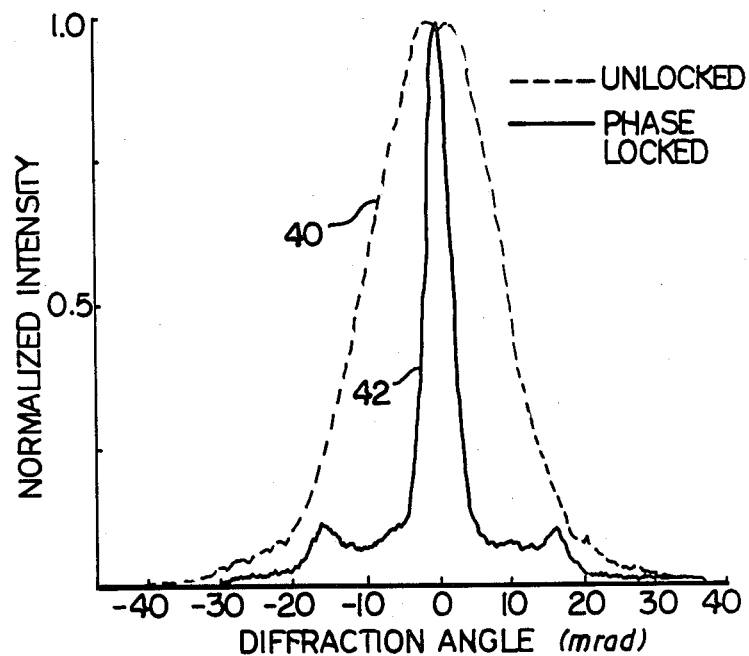
FIG. 5 is a graph of the far-field diffraction pattern from an array of unlocked and phase-locked lasers.

The far-field pattern was measured for both mirror positions. FIG. 5 contrasts the incoherent far-field ($Z_0=0$, curve 40) with the coherent one ($Z_0$ 3.1 mm, curve 42). The two curves 40 and 42 are normalized to their peak values. The FWHM of the main lobe from the coherent array is 3.7 millirad, corresponding to near diffraction-limited emission from the six strong lasers. The sidelobes of the coherent laser array are nearly eliminated by the beam expansion and recollimation provided by the microlens array. The central far field lobe contains 82% of the array power. In contrast, coherent operation without the microlens array would have resulted in approximately 20 major sidelobes and a central lobe with only 10% of the power.

Figure 6:
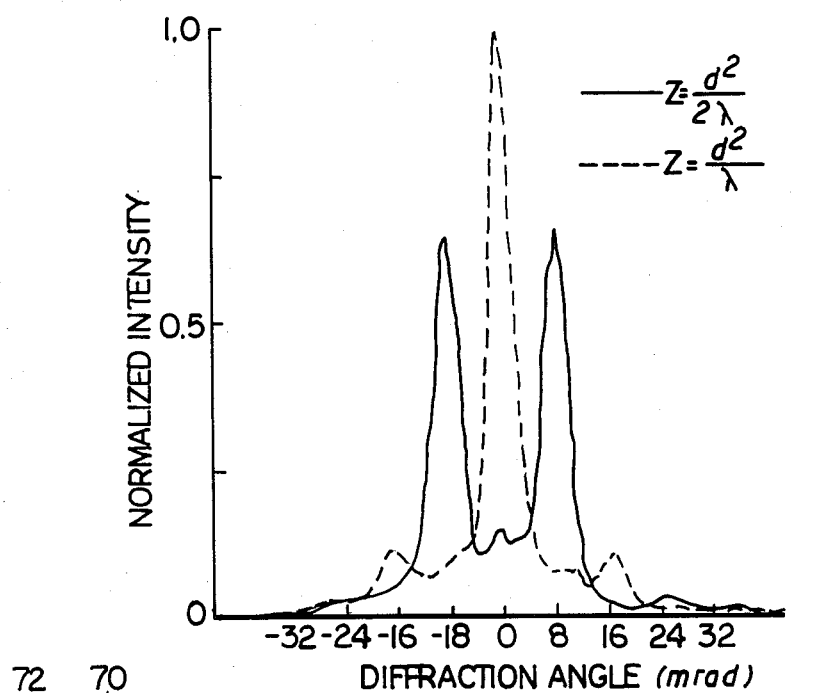
FIG. 6 is a graph of the far-field pattern from an array of lasers where the round trip distance $2Z_0$ between the microlens array and output mirror is given by the Talbot distance (dashed curve) and one-half the Talbot distance (solid curve)

Coherent lasing was also observed at a mirror spacing of 1.6 mm corresponding to a value of $n=\frac{1}{2}$ in equation (8). The far-field pattern shown in FIG. 6 consists of two equal peaks on either side of the optical axis. This corresponds to a phase state in which every other laser had a phase of $\pi$ radians. It can be shown that this supermode has Talbot self-images spaced at half the distance given by equation (8). In addition, the in-phase supermode produces a Talbot image shifted by $\frac{1}{2}$ period in this plane.

The laser beam addition technique of the present invention is applicable to two dimensional arrays as long as the ratio of the square of the spacings in the two directions forms a rational number expressed by the ratio of two integers:

$$\frac{d_2^2}{d_1^2} = \frac{n}{l}, \quad (9)$$

where
$d_2$ = lens spacinq in the y direction,
$d_1$ = lens spacing in the x direction, and
n and l are integers.

The spacing between the lenslet array and the output mirror is then given by $$Z_0 = \frac{ld_2^2}{\lambda} = \frac{nd_1^2}{\lambda} \quad (10)$$

where l and n are given by equation (9). A two-dimensional embodiment is illustrated in FIG. 7. A two-dimensional monolithic diode laser array 60 directs multiple laser beams onto a two-dimensional microlens array 62. A feedback mirror 64 is spaced from the microlens array 62 according to equation (10) to provide efficient coupling to lock the lasers for coherent operation.

Figure 8:
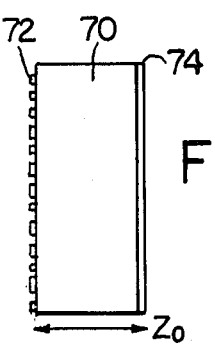
FIG. 8 is a cross-sectional view of a single element embodiment of the invention.

A compact, single element embodiment of the invention is shown in FIG. 8. A single substrate 70 of a material such as quartz has a microlens array 72 etched on one surface and includes a mirror coating 74 on a parallel surface. The separation between the microlens array 72 and mirror coating 74, the thickness of the substrate, satisfies equation (8) (or equation (10) for two-dimensions) with $\lambda$ being the wavelength of light in the substrate. When the substrate 70 is quartz (refractive index=1.45), and $\lambda_{air}=0.8$ $\mu$m, d=50 $\mu$m, n=1, one Talbot distance within the substrate becomes 4.5 mm rather than the 3.1 mm when the microlens array and mirror are separated by air.

The optical apparatus of the present invention combines the output of multiple lasers to produce a coherent beam having a single-lobed, far-field pattern. Coherence is achieved by diffractive coupling, the high efficiency of which is ensured by separating the lenslet array from the feedback mirror by integer or half integer multiples of the Talbot distance.

It is recognized that modifications and variations of the present invention will occur to those skilled in the art and it is intended that all such modifications and variations be included within the scope of the appended claims.

What is claimed is:

1. Apparatus for coherent beam combining of lasers comprising:
   a diffractive lenslet array for receiving light from the lasers, the array spaced from a partially reflecting flat mirror by a distance $Z=nd^2/\lambda$ where n is an integer or half integer, $\lambda$ is the laser wavelength and d is the diameter of the lenslets in the array.

2. The apparatus of claim 1 wherein the lenslets abut one another producing a fill factor close to one.

3. The apparatus of claim 1 wherein each of the lenslets is a multistep diffractive lens.

4. The apparatus of claim 3 including four steps.

5. The apparatus of claim 3 wherein the lenslets include laser wavefront aberration correction.

6. The apparatus of claim 5 wherein the lenslets include elliptical Fresnel zone patterns for astigmatic correction.

7. The apparatus of claim 1 wherein the lenslet array is one dimensional.

8. The apparatus of claim 1 wherein the lenslet array is two-dimensional.

9. The apparatus of claim 8 wherein the ratio of the square of the lenslet spacings in the two dimensions forms a rational number expressed by the ratio of two integers.

10. The apparatus of claim 8 wherein the lenslet spacings in the two dimensions are integer multiples of one another.

11. The apparatus of claim 1 wherein n=1.

12. The apparatus of claim 1 wherein n=>1.

13. The apparatus of claim 1 wherein the f/# of each lenslet is selected to match the divergence of the lasers in the laser array, and the corresponding focal length of each lenslet maximizes the power in the central lobe of the laser array far field pattern.

14. Optical element comprising:
    a substrate with first and second parallel surfaces, the first surface including an etched diffractive lenslet array for receiving light from the lasers and the second surface coated to produce a partially reflecting mirror, the substrate having a thickness of $Z=nd^2/\lambda$ where n is an integer or half integer, $\lambda$ is the wavelength of light in the substrate and d is the spacing of the lenslets in the array.

15. Coherent laser beam combining system comprising:
    an array of lasers operating at a wavelength $\lambda$ and having a spacing d;
    a diffractive lenslet array for receiving light from the lasers, the lenslets having a spacing d; and
    a partially reflecting mirror spaced from the lenslet array by a distance $Z=nd^2/\lambda$, where n is an integer or half integer.

* * * * *

UNITED STATES PATENT AND TRADEMARK OFFICE
CERTIFICATE OF CORRECTION

PATENT NO. : 4,813,762
DATED : March 21, 1989
INVENTOR(S) : James R. Leger et al.

It is certified that error appears in the above-identified patent and that said Letters Patent are hereby corrected as shown below:

Column 1, line 24, change "single lobed" to --single-lobed--;
         line 27, change "single lobed" to --single-lobed--;
         line 64, change "four level" to --four-level--;
         line 66, change "phase locked" to --phase-locked--.
Column 2, line 4, change "round trip" to --round-trip--;
         line 10, change "surface emitting" to --surface-emitting--;
         line 28, change "one dimensional" to --one-dimensional--.
Column 4, line 23, change "chromium coated" to --chromium-coated--;
         line 24, change "vacuum contact" to --vacuum-contact--.
Column 5, line 26, change "self image" to --self-image--;
         line 67, change "($Z_0$3.1 mm," to --($Z_0$=3.1 mm,--.
Column 6, line 6, change "far field" to --far-field--;
         line 8, change "without" to --<u>without</u>--;
         line 30, change "two dimensional" to --two-dimensional--;
         line 39, change "1" to --$\ell$--;
         line 46, change "1" to --$\ell$--.

UNITED STATES PATENT AND TRADEMARK OFFICE
CERTIFICATE OF CORRECTION

PATENT NO. : 4,813,762

DATED : March 21, 1989

INVENTOR(S) : James R. Leger et al

It is certified that error appears in the above-identified patent and that said Letters Patent is hereby corrected as shown below:

Column 7, line 35, change "one dimensional" to --one-dimensional--.

Signed and Sealed this

First Day of August, 1989

Attest:

DONALD J. QUIGG

Attesting Officer

Commissioner of Patents and Trademarks